(12) United States Patent
Cho

(10) Patent No.: US 6,996,753 B2
(45) Date of Patent: Feb. 7, 2006

(54) WAFER BURN-IN TEST MODE CIRCUIT

(75) Inventor: Yong Deok Cho, Kyungki-Do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 493 days.

(21) Appl. No.: 10/299,494

(22) Filed: Nov. 19, 2002

(65) Prior Publication Data

US 2003/0126529 A1    Jul. 3, 2003

(30) Foreign Application Priority Data

Dec. 20, 2001   (KR)   ............. 10-2001-0081928

(51) Int. Cl.
*G11C 29/00*    (2006.01)

(52) U.S. Cl. ................... 714/718; 365/201
(58) Field of Classification Search ............ 714/718, 714/30; 365/200, 201
See application file for complete search history.

(56) References Cited

U.S. PATENT DOCUMENTS

| | | | | |
|---|---|---|---|---|
| 5,381,373 A | * | 1/1995 | Ohsawa ............ | 365/201 |
| 5,617,531 A | * | 4/1997 | Crouch et al. ........ | 714/30 |
| 6,233,184 B1 | * | 5/2001 | Barth et al. ........ | 365/201 |
| 6,285,610 B1 | * | 9/2001 | Chun ............ | 365/201 |
| 6,341,089 B1 | * | 1/2002 | Sawada et al. ........ | 365/191 |
| 6,400,173 B1 | * | 6/2002 | Shimizu et al. ........ | 324/765 |
| 6,414,890 B2 | * | 7/2002 | Arimoto et al. ........ | 365/201 |
| 6,490,223 B1 | * | 12/2002 | Han et al. ........... | 365/233 |
| 2002/0021603 A1 | * | 2/2002 | Lim et al. ........... | 365/201 |

* cited by examiner

*Primary Examiner*—Joseph Torres
(74) *Attorney, Agent, or Firm*—Marshall, Gerstein & Borun LLP

(57) ABSTRACT

A wafer burn-in test mode circuit includes a command decoder, an address latch circuit configured to latch an address signals, a register configured to store a wafer burn-in address signal from the address latch, a wafer burn-in test mode entry circuit configured to generate a wafer burn-in test mode entry signal according to the wafer burn-in address signal and a command signal from the command decoder, a shift registers configured to shift the wafer burn-in address signal according to the wafer burn-in test mode entry signal and a wafer burn-in clock signal, a wafer burn-in test priority decision circuit configured to output test priority signals according to output signals of the shift registers, and a decoder configured to decode the output signals of the shift registers according to the priority signals and configured to output wafer burn-in test signals corresponding to a wafer burn-in test item.

14 Claims, 12 Drawing Sheets

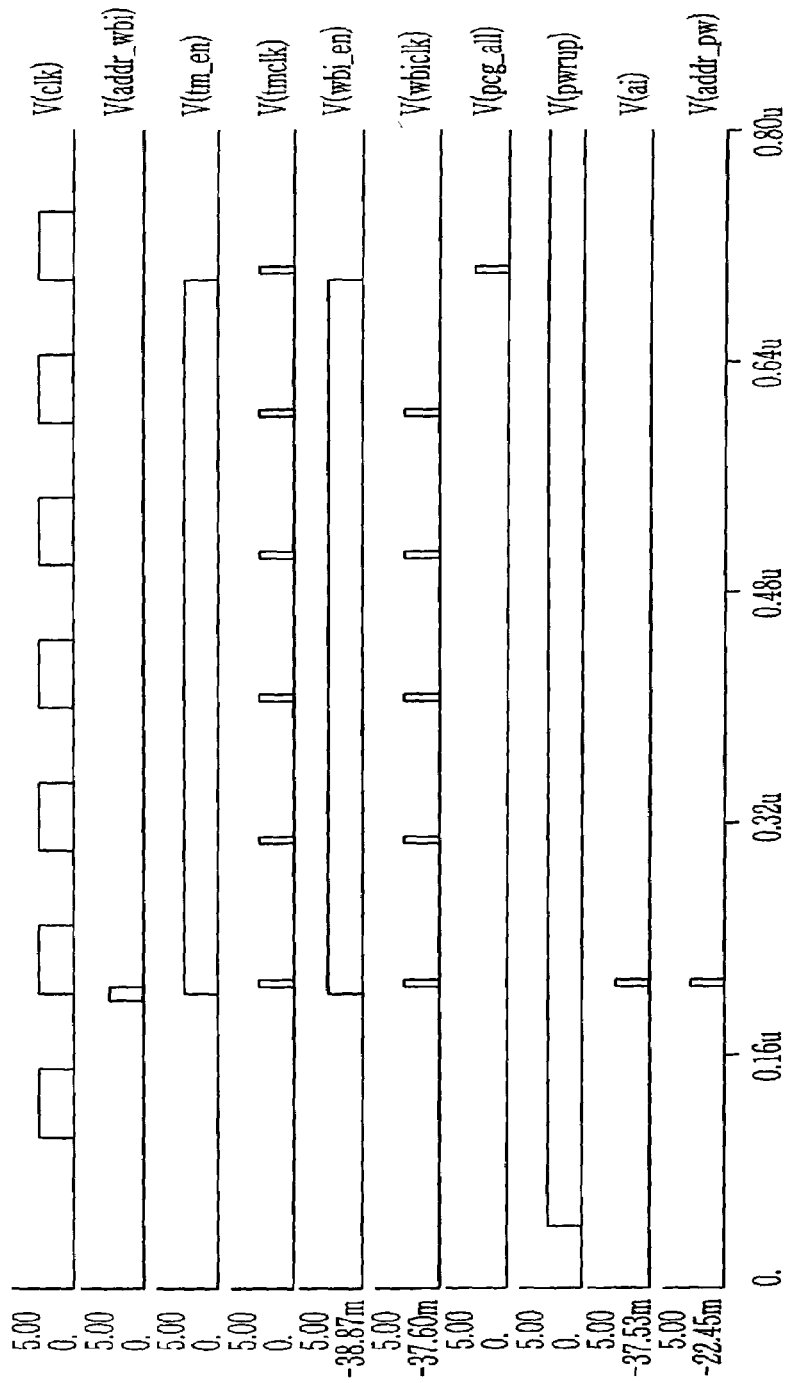

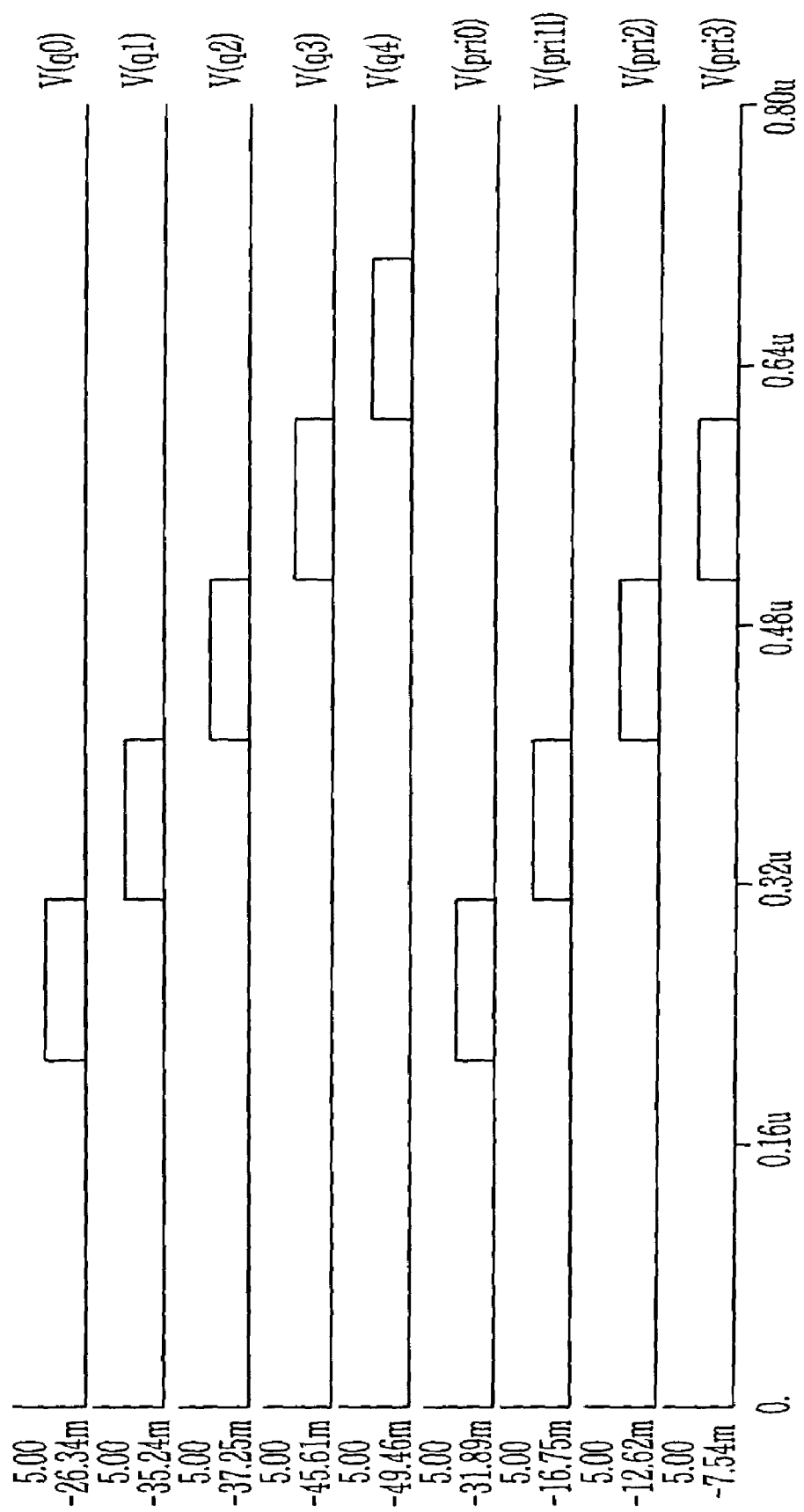

WAFER BURN-IN TEST MODE CIRCUIT

TECHNICAL FIELD

The present disclosure relates generally to semiconductor memory devices, and more particularly, to a wafer burn-in test mode circuit.

BACKGROUND

A test is performed to verify the performance and reliability of semiconductor memory devices and to improve the throughput. Among those things, a burn-in test is used to test reliability of the semiconductor memory devices. The burn-in test includes applying a stress to semiconductor memory devices for a long time under a high voltage and a high temperature to find defective memory devices. In particular, there is an increasing demand for a die of a wafer state rather than a package state. Recently, there is an increasing need for the package shape such as MCM or CSP shape. The wafer burn-in test becomes thus increasing important. Further, the wafer burn-in test can reduce the time and cost of the burn-in test performed in a package level.

Referring now to FIG. 1, a construction of a conventional wafer burn-in test mode circuit is described. A command decoder 101 receives various signals necessary for semiconductor memory devices including a row address select bar signal RAS/, a column address select bar signal CAS/, a write enable bar signal WE/, a chip select bar signal CS/, a clock enable signal CKE and a clock signal CLK to generate various commands necessary to drive the semiconductor memory devices. For example, the command decoder 101 generates a mode register set command signal MRS and a precharge signal Precharge All.

An address latch 102 receives and latches a plurality of address signals A0 through An depending on a command signal from the command decoder 101. The mode register 103 stores an address signal for a normal operation from the address latch 102 depending on the mode register set command signal MRS from the command decoder 101. A normal test mode register 104 stores an address signal for a normal test from the address latch 103 depending on the mode register set command signal MRS from the command decoder 101.

A test mode entry circuit 105 receives the mode register set command signal MRS from the command decoder 101 and a corresponding address signal from the address latch 102 as inputs to generate a test mode entry signal TM_Entry for performing the normal test. A wafer burn-in test mode register 106 stores an address for a wafer burn-in test from the address latch 103 depending on the mode register set command signal MRS from the command decoder 101. A wafer burn-in test mode entry circuit 107 receives the mode register set command signal MRS from the command decoder 101 and a corresponding address signal from the address latch 102 as inputs to generate a wafer burn-in test mode entry signal WBI_Entry for performing the wafer burn-in test.

A mode register decoder 108 decodes an output signal from the mode register 103 depending on the mode register set signal MRS from the command decoder 101 to output a control signal for a normal operation of the semiconductor memory devices. A normal test mode register decoder 109 decodes an output signal from the normal test mode register 104 depending on the mode register set signal MRS from the command decoder 101 and the test mode entry signal TM_Entry from the test mode entry circuit 105 to output normal test signals TM0–TM131.

A wafer burn-in test mode register decoder 110 decodes an output signal from the wafer burn-in test mode register 106 depending on the mode register set signal MRS from the command decoder 101 and the wafer burn-in test mode entry signal WBI_Entry from the wafer burn-in test mode entry circuit 107 to output wafer burn-in test signals WBI_TM0–WBI_TM15.

The conventional wafer burn-in test mode circuit constructed above, however, is almost similar to a normal test mode circuit or is included in the normal test mode circuit if there is a few item. The wafer burn-in test mode circuit requires more than one address signals to distinguish the normal test mode and the wafer burn-in test mode. Thus, four address signals are required to test more than five items. In view of a characteristic of the burn-in apparatus, however, the number of a channel available is only 13 through 18. Thus, if the number of a wafer burn-in test item is increased, there is a problem that the number of a necessary channel is short. Further, upon a layout, the number of a global line necessary in routing between the wafer burn-in test mode circuit and the address latch is increased.

Therefore, there is a need to provide a wafer burn-in test mode circuit capable of overcoming the limits of a burn-in apparatus having a small number of a channel to support various test items with only a single address signal in a wafer burn-in test, and a need for a wafer burn-in test mode circuit capable of reducing the number of a global line upon a layout.

SUMMARY OF THE DISCLOSURE

To minimize the number of an address necessary to decode test items WBI_TM0–WBI_TM15 in a wafer burn-in test mode, only a single address signal is received to decode an output of each of the stages using a shift register. Therefore, only a single address signal is required. For example, the conventional wafer burn-in test mode circuit shown in FIG. 1 requires four address inputs for testing more than nine items and more than one address signal in the wafer burn-in test mode entry circuit for entering the wafer burn-in test mode. Thus, the conventional circuit requires at least five address inputs. In the present disclosure, however, the wafer burn-in test mode can be entered with only the same one address signal. Further, the number of a test item is not limited by increasing the number of a stage of the shift register.

To do so, a wafer burn-in test mode circuit is described herein. The wafer burn-in test mode circuit comprises a command decoder for creating a plurality of command signals in response to input signals to drive a semiconductor memory device; an address latch for latching a plurality of address signals; a register for storing a wafer burn-in address signal for a wafer burn-in test from said address latch according to the command signal from said command decoder; a wafer burn-in test mode entry circuit to generate a wafer burn-in test mode entry signal for performing the wafer burn-in test according to the wafer burn-in address signal and the command signal; a plurality of shift registers for shifting the wafer burn-in address signal inputted from said register according to the wafer burn-in test mode entry signal and a wafer burn-in clock signal; a wafer burn-in test priority decision circuit for outputting test priority signals according output signals of the plurality of the shift registers; and a decoder for decoding the output signals of the shift registers according to the priority signals and for outputting a wafer burn-in test signal corresponding to a wafer burn-in test item.

BRIEF DESCRIPTION OF THE DRAWINGS

This disclosure will be described in terms of several embodiments to illustrate its broad teachings. Reference is also made to the attached drawings.

FIG. 9A to FIG. 9D are timing diagrams showing results of verifying a wafer burn-in test circuit by using CAD.

DETAILED DESCRIPTION

Figure 1:
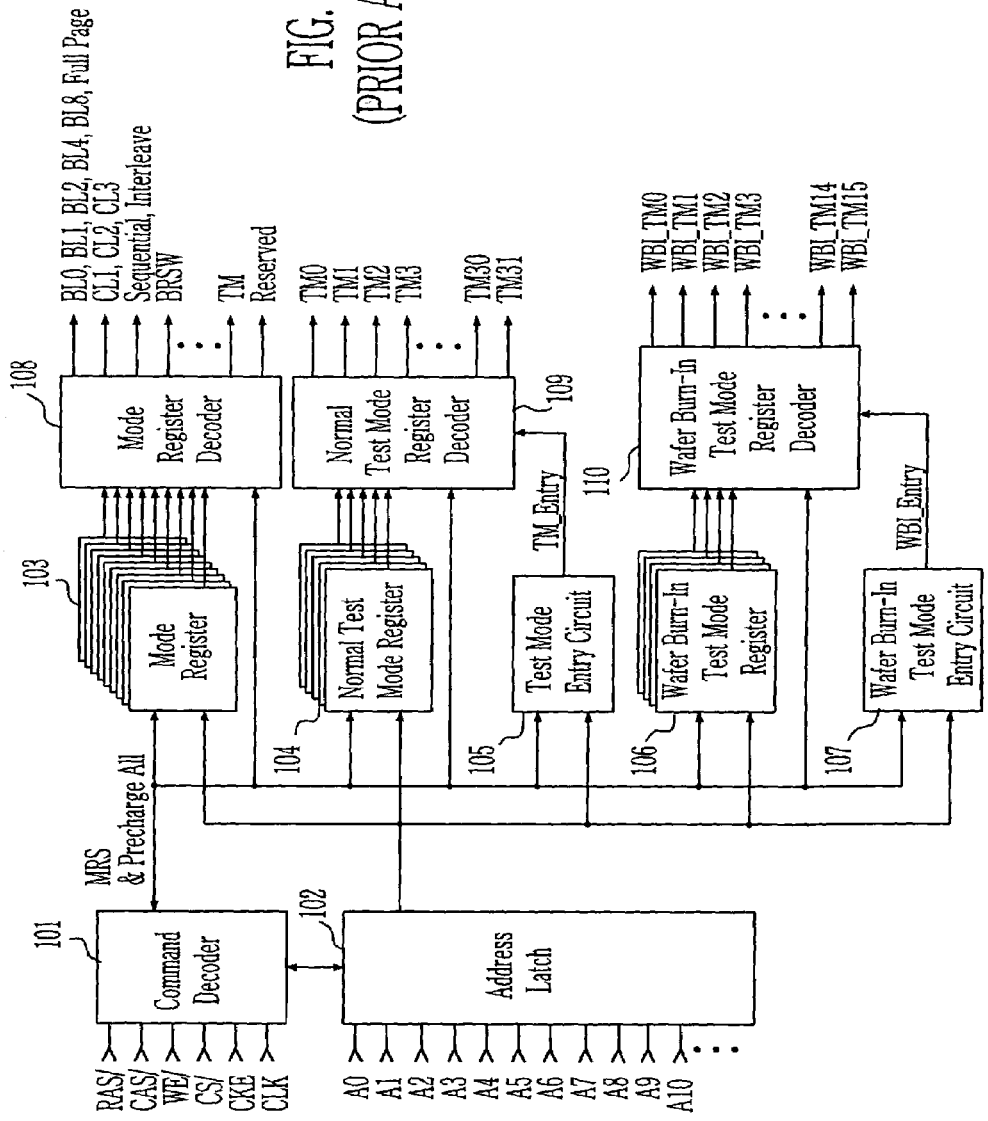
FIG. 1 is a block diagram of a conventional wafer burn-in test mode circuit.

The present disclosure will be described in detail by way of a preferred embodiment with reference to accompanying drawings, in which like reference numerals are used to identify the same or similar parts.

Figure 2:
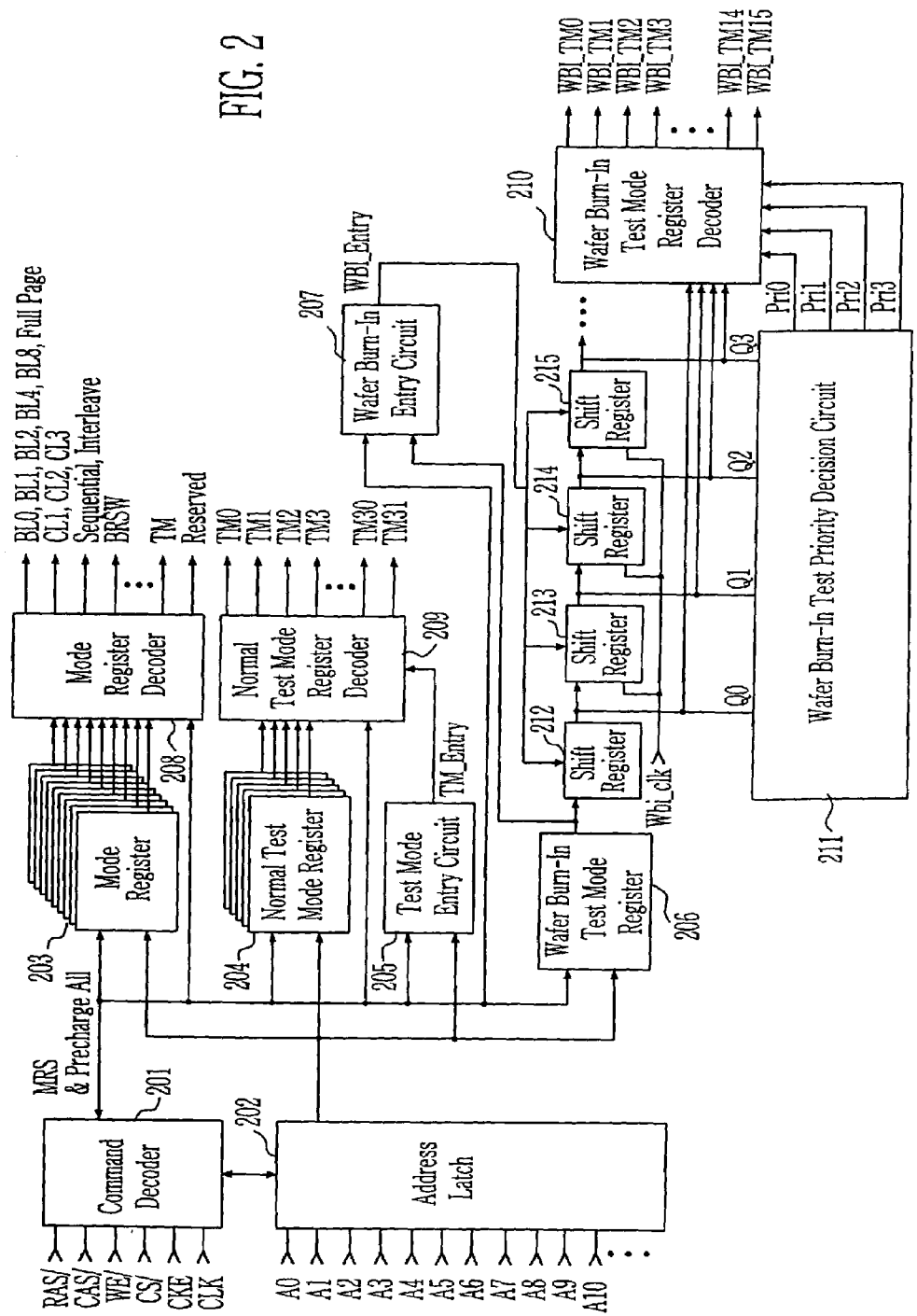
FIG. 2 is a block diagram of a wafer burn-in test mode circuit having a shift register.

Referring now to FIG. 2, a wafer burn-in test mode circuit having a shift register is described. A command decoder 201 receives various signals necessary for semiconductor memory devices including a row address select bar signal RAS/, a column address select bar signal CAS/, a write enable bar signal WE/, a chip select bar signal CS/, a clock enable signal CKE and a clock signal CLK to generate various commands necessary to drive the semiconductor memory devices. For example, the command decoder 201 generates a mode register set command signal MRS and a pre-charge signal pcg_all.

An address latch 202 receives and latches a plurality of address signals A0–An depending on a command signal from the command decoder 201. The mode register 203 stores an address signal for a normal operation from the address latch 202 depending on the mode register set command signal MRS from the command decoder 201. A mode register decoder 208 decodes an output signal from the mode register 203 depending on the mode register set signal MRS from the command decoder 201 to output a control signal for a normal operation of the semiconductor memory devices.

A normal test mode register 204 stores an address signal for a normal test from the address latch 202 depending on the mode register set command signal MRS from the command decoder 201. A test mode entry circuit 205 receives the mode register set command signal MRS from the command decoder 201 and a corresponding address signal from the address latch 202 as inputs to generate a test mode entry signal TM_Entry for performing the normal test.

A normal test mode register decoder 209 decodes an output signal from the normal test mode register 204 depending on the mode register set signal MRS from the command decoder 201 and the test mode entry signal TM_Entry from the test mode entry circuit 205 to output normal test signals TM0–TM31.

A wafer burn-in test mode register 206 stores a single address signal for a wafer burn-in test from the address latch 202 depending on the mode register set command signal MRS from the command decoder 201. A wafer burn-in test mode entry circuit 207 receives the mode register set command signal MRS from the command decoder 201 and an address signal from the wafer burn-in test mode register 206 to generate a wafer burn-in test mode entry signal WBI_Entry for performing the wafer burn-in test.

A plurality of shift registers 212–215 are driven depending on the wafer burn-in clock signal wbi_clk and the wafer burn-in test mode entry signal WBI_Entry. The plurality of shift registers also shift the address signal from the wafer burn-in test mode register 206. A wafer burn-in test priority decision circuit 211 senses an output of each of stages of the shift registers 212–215 to output test priority signals Pri0–Pri4 for sequentially performing a test. A wafer burn-in test mode register decoder 210 decodes the output of each of the stages in the plurality of shift registers 212–215 depending on the test priority signals Pri0–Pri4 to output wafer burn-in test signals $WBI_{13}TM0$-WBI_TM15 corresponding to wafer burn-in test items.

Figure 3:
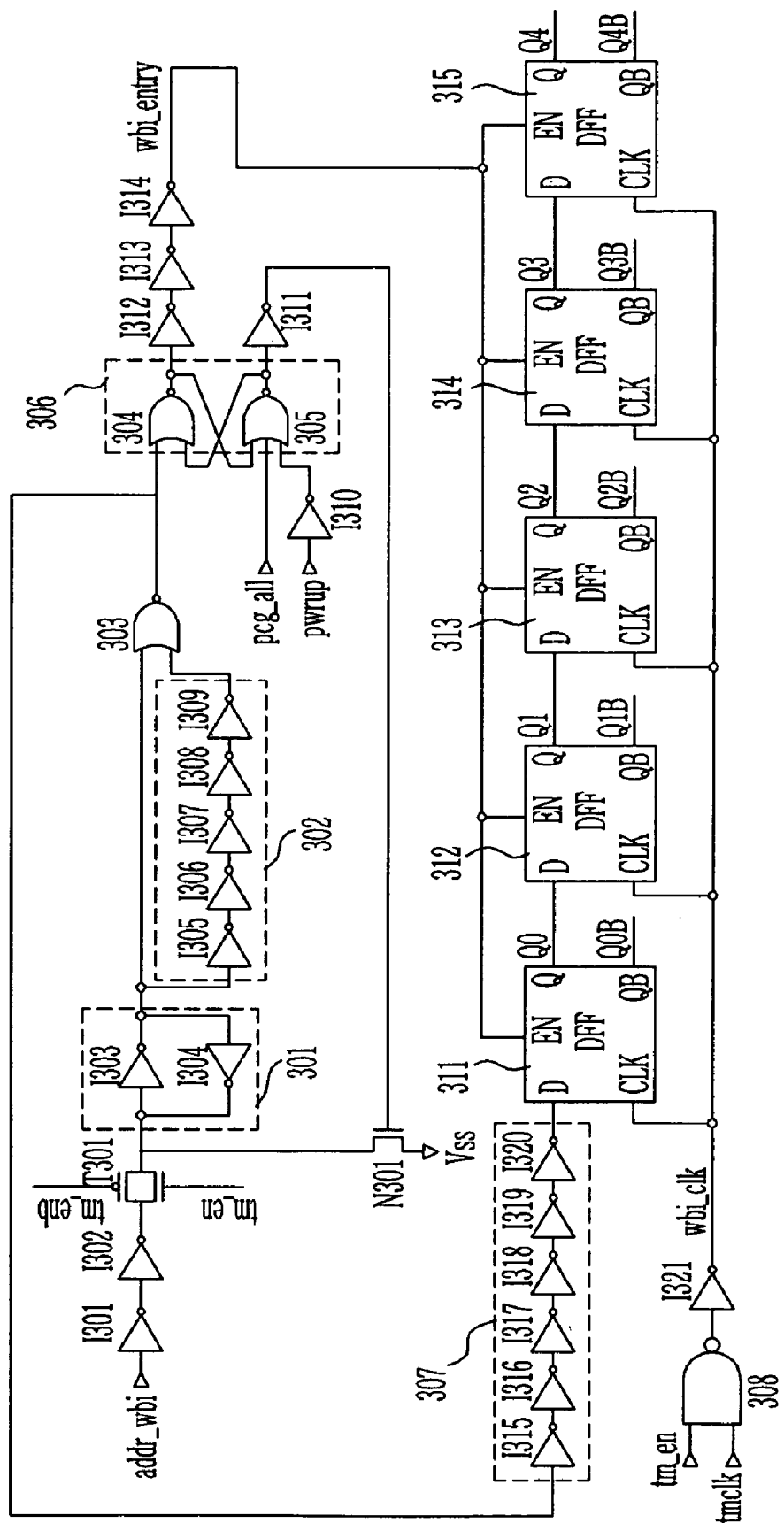
FIG. 3 shows a wafer burn-in test mode entry circuit.

Referring now to FIG. 3, a wafer burn-in test mode entry circuit 207 and a shift register are described. A transmission gate T301 is driven by a test mode enable signal tm_en and a test mode enable bar signal tm_enb and transfers a wafer burn-in address signal addr_wbi input through the first and second inverters I301, I302. The wafer burn-in address signal addr_wbi from the transmission gate T301 is then latched in a first latch means 301 having the third and fourth inverters I303, I304. An output of the first latch means 301 is applied to an terminal of an first NOR gate 303 and to an inverse delay means 302 having the fifth inverter I305 through the ninth inverter I309. An output of the inverse delay means 302 is applied to an another terminal of the first NOR gate 303. The output of the first latch means 301 is inverted and delayed by the inverse delay means 302. An output signal from the first NOR gate 303 is delayed in a delay means 307 having the fifteenth inverter I315 through the twentieth inverter I320 and then inputted to a flop-flip circuit 311 operating as a shift register. Also, the output signal from the first NOR gate 303 is inputted to a second latch means 306 having second and third NOR gates 304 and 305.

At this time, the third NOR gate 305 of the second latch means 306 logically combines the pre-charge signal peg_all and a power-up signal pwrup inverted through the tenth inverter I310. An output signal from the third NOR gate 305 is inputted to one input terminal of the second NOR gate 304 and is then inverted through the eleventh inverter I311, which then controls a NMOS transistor N301 connected between an output terminal of the transmission gate T301 and the ground terminal Vss. The second NOR gate 304 logically combines an output signal of the first NOR gate 303 and an output signal of the third NOR gate 305. An output signal from the second NOR gate 304 is inputted to the other input terminal of the third NOR gate 305.

Further, an output signal of the second NOR gate 304 is inversely delayed through the twelfth inverter I312 through the fourteenth inverter I314 and then inputted to a plurality of flop-flip circuits 311–315 as a wafer burn-in test mode entry signal wbi_entry. The plurality of the flop-flip circuits 311–315 are driven by the wafer burn-in test mode entry signal wbi_entry and the wafer burn-in clock signal wbi_clk to shift the wafer burn-in test address signal addr_wbi inputted through the delay means 307. At this time, the wafer burn-in clock signal wbi_clk is a signal in which the test mode clock signal tmclk and the test mode enable signal tm_en are logically combined by the NAND gate 308 and is then inverted through the twenty-first inverter I321.

Figure 9C:
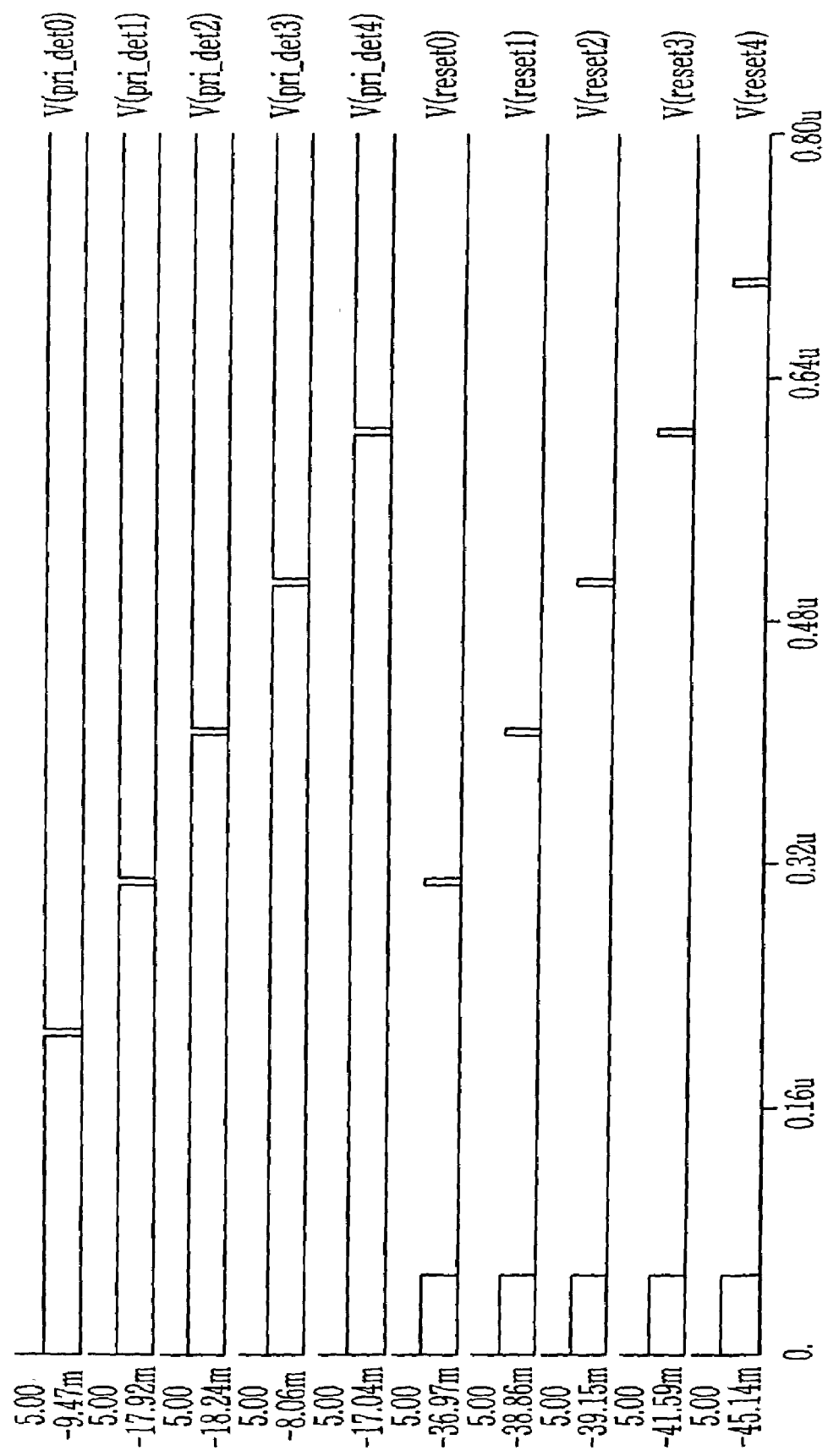
Figure 9D:
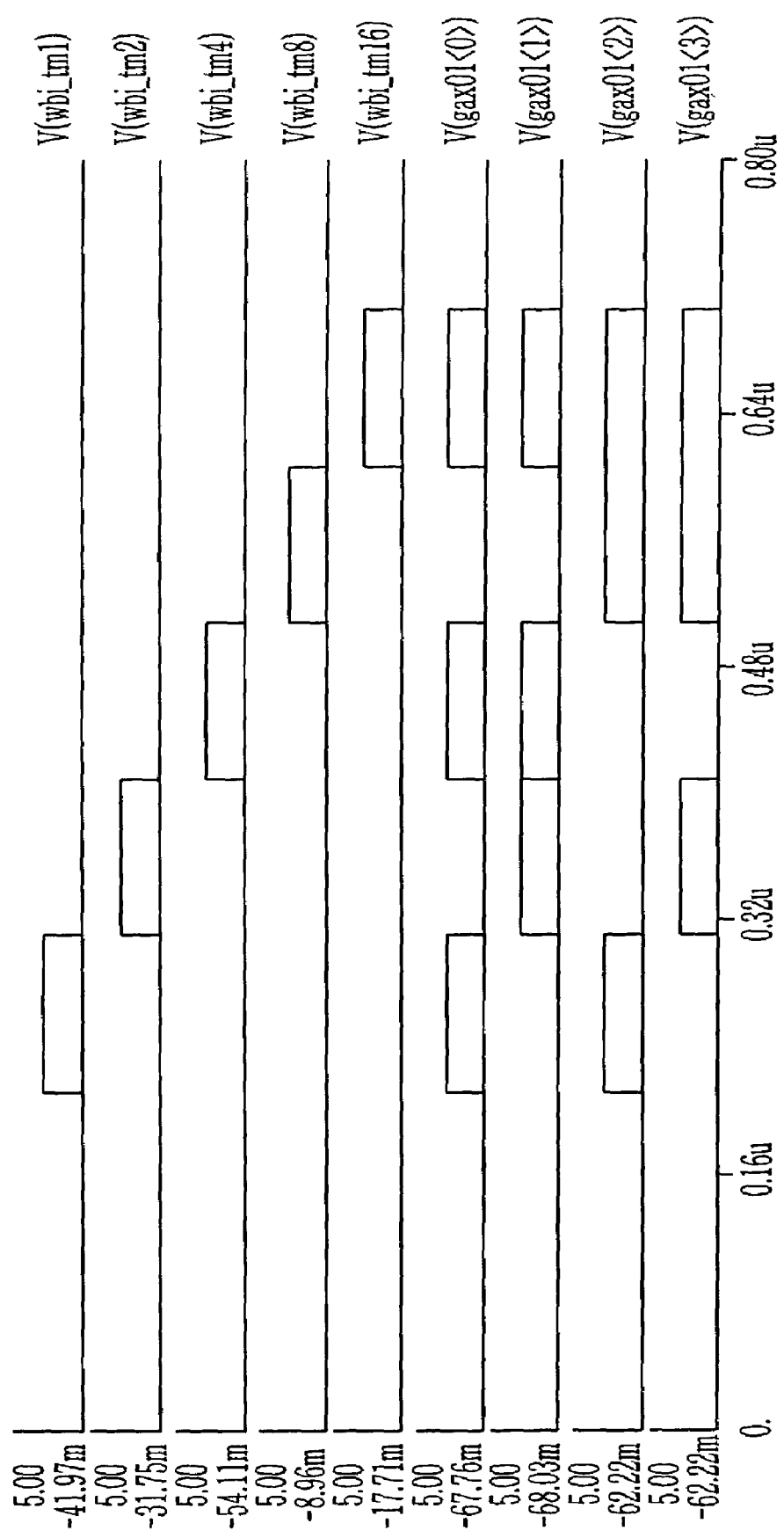

A method of driving the wafer burn-in test mode entry circuit and the shift register constructed above is described by reference to timing diagrams of FIGS. 9A and 9B. A signal, which is inverted to a HIGH state from the power-up signal pwrup applied in a LOW state at an initial state through the tenth inverter I310, and the precharge signal peg_all of a LOW state are logically combined in the third NOR gate 305 to output a signal of a LOW state. An output signal of the third NOR gate 305 maintaining a LOW state is inverted to a HIGH state through the eleventh inverter I311 to turn on the NMOS transistor N301. Therefore, an output terminal of the transmission gate T301 maintains an initial LOW state. If the power-up signal pwrup is shifted to a HIGH state, the third NOR gate 305 outputs a signal of a HIGH state, which is then inverted to a LOW state through the eleventh inverter I311 to turn off the NMOS transistor N301.

If the test mode enable signal tm_en is applied with a HIGH state, the test mode enable bar signal tm_enb is applied with a LOW state. Thereby, the transmission gate T301 is turned on. The wafer burn-in address signal addr_wbi applied with a HIGH state is inputted through the first and second inverters I301 and I302 and is then transferred the transmission gate T301 that is kept on. The wafer burn-in address signal addr_wbi transferred through the transmission gate T301 is latched in the first latch means 301, which then outputs a signal of a LOW state. An output signal of the first latch means 301 kept at a LOW state is inputted to one input terminal of the first NOR gate 303 to output a signal of a HIGH state before it is inputted the other input terminal of the first NOR gate 303 through the inverse delay means 302 having the plurality of the inverters I305–I309.

The first NOR gate 303 outputs a signal of a HIGH state. The signal of a HIGH state is then delayed by a given time through the delay means 307 having the plurality of the inverters I315–I320 and is then inputted to the flop-flip circuit 311. Meanwhile, an output signal of the first NOR gate 303 kept at a HIGH state is latched in the second latch means 306 having the second and third NOR gates 304 and 305.

The second latch means 306 latches the output signal of the first NOR gate 303 to output a signal of a LOW state. The output signal of the second latch means 306 at a LOW state is inversely delayed by the twelfth inverter I312, the thirteenth inverter I313, and the fourteenth inverter I314. The delayed inverse output signal is then inputted to each of the state in the flop-flip circuits 311–315 as the wafer burn-in test mode entry signal wbi_entry is a HIGH state. At this time, the wafer burn-in test mode entry signal wbi_entry is outputted with a LOW state because the first NOR gate 303 outputs a signal of a LOW state when the output signal of the inverse delay means 302 is inputted to the first NOR gate 303.

Meanwhile, if the test mode enable signal tm_en is shifted to a HIGH state and the test mode clock signal tmclk is shifted to a HIGH state, the NAND gate 308 logically combines the two signals and outputs a signal of a LOW state. The output signal of the NAND gate 308 kept at a LOW state is inverted to a HIGH state through the twenty-first inverter I321 and is then inputted to each of the stages of the flop-flip circuits 311–315 with the wafer burn-in test mode clock signal wbi_clk. The flop-flip circuits 311–315 are driven depending on the wafer burn-in test mode entry signal wbi_entry and the wafer burn-in test mode clock signal wbi_clk to shift the wafer burn-in test address signal inputted through the delay means 307.

Thereafter, if the pre-charge signal peg_all for pre-charging all the banks is shifted to a HIGH state, the third NOR gate 305 outputs a signal of a LOW state. The signal of the LOW state is inverted to a HIGH state through the eleventh inverter I311 to turn on the NMOS transistor N301. Therefore, as the potential of the output terminal of the transmission gate T301 is passed to the ground terminal Vss, it prevents the wafer burn-in test address signal addr_wbi from being inputted to the flop-flip circuit 311. Further, as the wafer burn-in test mode entry signal wbi_entry of a LOW state is applied, the flop-flip circuits 311–315 are disabled.

Figure 4A:
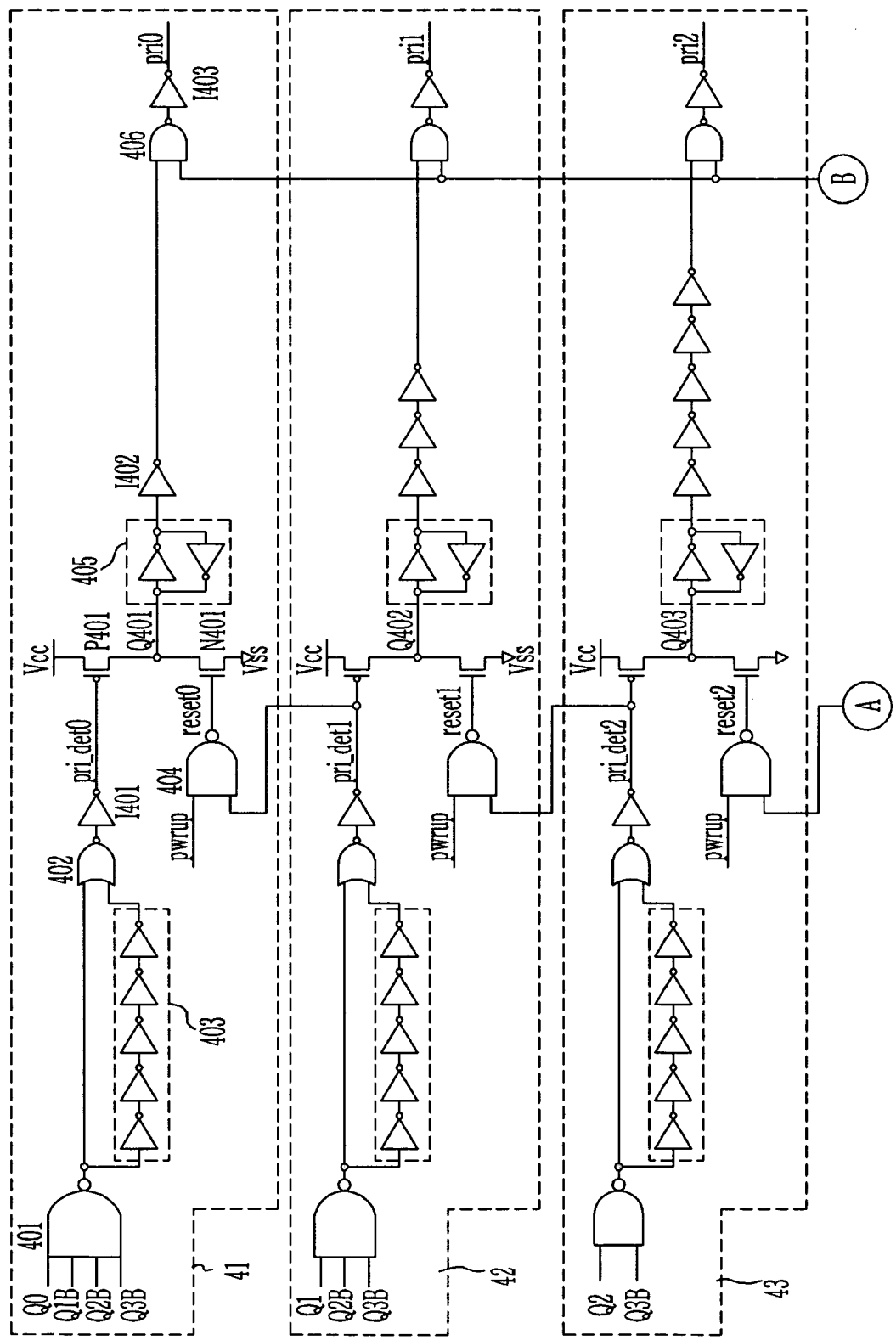
FIG. 4A and FIG. 4B show priority decision circuits of a wafer burn-in test item.
Figure 4B:
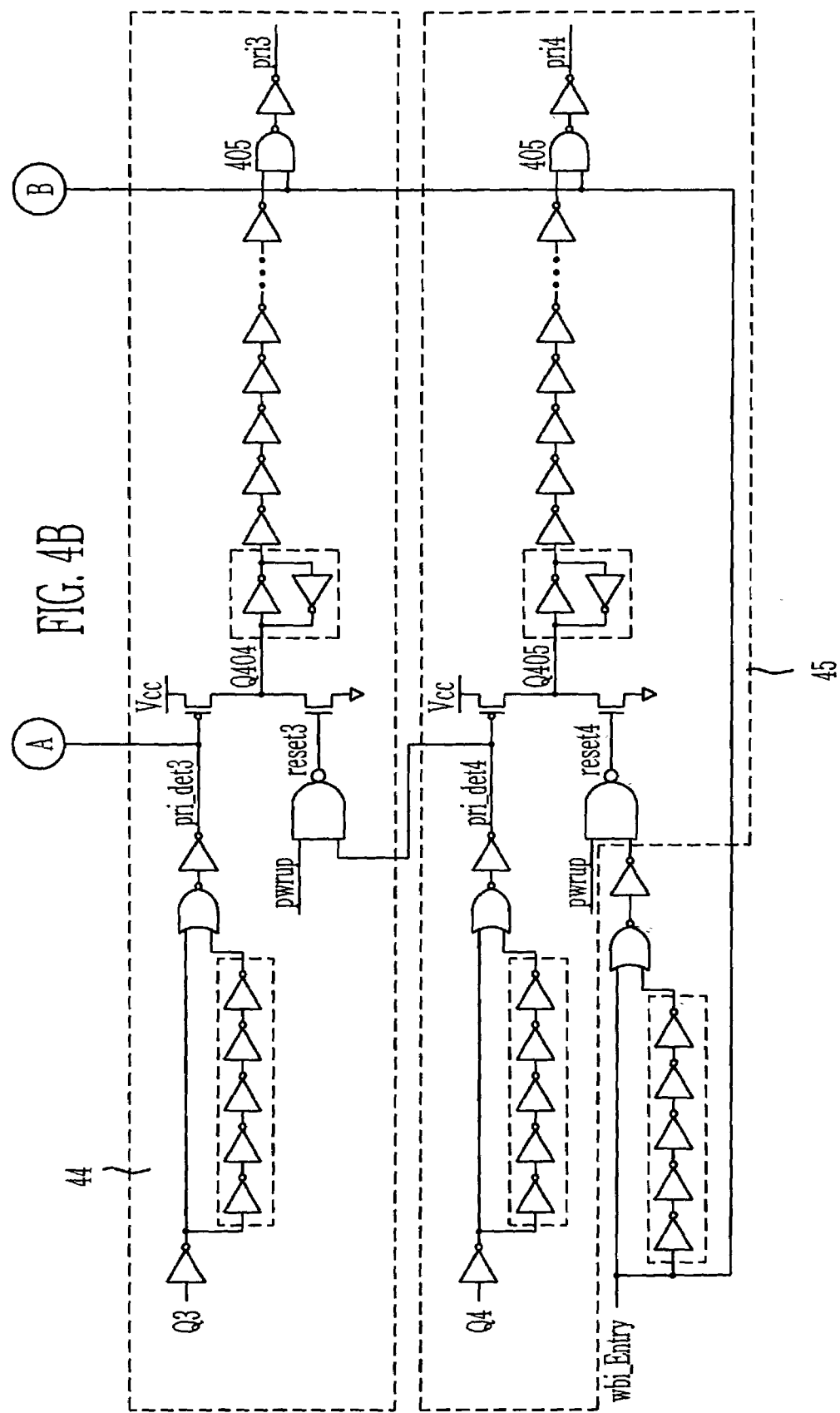

FIG. 4A and FIG. 4B show the priority decision circuit in the wafer burn-in test mode circuit. Although multiple priority decisions can be constructed depending on the number of shift registers, FIG. 4A and FIG. 4B show a circuit for outputting five priority signals pri0–pri4 using five shift registers. In this embodiment, the first priority decision means 41 will be explained as an example.

The first NAND gate 401 logically combines an output signal Q0 of the first shift register 311 and output bar signals Q1B, Q2B and Q3B of second, third and fourth shift registers 312, 313, 314. The NOR gate 402 logically combines an output signal of the first NAND gate 401 and a signal of the output signal of the first NAND gate 401 inversely delayed through the inverse delay means 403 having the plurality of inverters. An output signal of the NOR gate 402 is inverted through the first inverter I401 to output the first priority decision signal pri_det0 to drive a first PMOS transistor P401 connected between the power supply terminal Vcc and the first node Q401. The first NMOS transistor N401 connected between the first node Q401 and the ground terminal Vss is driven by the first reset signal reset0. At this time, the first reset signal reset0 is an output signal in which the power-up signal pwrup and the second priority decision signal pri_det1 of the second priority decision means 42 are logically combined by the second NAND gate 404.

The potential of the first node Q401 is latched by the first latch means 405 and an output signal of the first latch means 405 is inverted through the second inverter I402, which is then inputted to one input terminal of the third NAND gate 406. The third NAND gate 406 logically combines an output signal of the second inverter I402 and the wafer burn-in test mode entry signal wbi_entry. An output signal of the third NAND gate 406 is inverted by the third inverter I403 and is then outputted as the first priority signal pri0.

As noted above, the first priority decision means 41 receives the output signal Q0 of the first shift register 311 and the output bar signals Q1B, Q2B and Q3B of the second, third and fourth shift registers 312, 313, 314 as inputs. The second priority decision means 42, however, receives the output signal Q1 of the second shift register 312 and the output bar signals Q2B and Q3B of the third and fourth shift registers 313, 314 as inputs. Further, the third priority decision means 43 receives the output signal Q2 of the third shift register 313 and the output bar signal Q3B of the fourth shift register 314 as inputs. In addition, each of the fourth and fifth priority decision means 44 and 45 receives the output signals Q3 and Q4 of the fourth and fifth shift registers 314, 315 as an input, respectively.

Also, the output signal of the latch means 404 in the first priority decision means 41 is inverted by a single inverter I402 and is then inputted to the third NAND gate 406. As the number of inverters from the second priority decision means 42 to the fifth priority decision means 45 is increased, however, the output signal of the latch means 404 is inverted while the delay time is increased. In other words, in the second priority decision means 42, the output signal of the latch means is inversely delayed through three inverters. In the third priority decision means 43, the output signal of the latch means is inversely delayed through five inverters. Similarly, in the fourth priority decision means 44, the output signal of the latch means is inversely delayed through seven inverters. In the fifth priority decision means 45, the output signal of the latch means is inversely delayed through nine inverters. Then, the fifth reset signal reset4 applied to the fifth priority decision means 45 is generated using the power-up signal pwrup and the wafer burn-in test entry signal wbi_entry.

An operation of driving the priority decision circuit constructed above is described by reference to timing diagrams of FIG. 9A to FIG. 9D. In this embodiment, the first priority decision means 41 is described as an example.

If the output signal Q0 is applied with a HIGH state by the first shift register 311, the output signals of the second through fifth shift registers 312–315 are applied with a LOW state. Therefore, the first NAND gate 401 logically combines the output signal Q0 of the first shift register 311 of a HIGH state and the output bar signals Q1B, Q2B and Q3B of second, third and fourth shift registers 312, 313, 314 of a HIGH state to output a signal of a LOW state. The signal of a LOW state is then inverted through the NOR gate 402 and is then again inverted through the first inverter I401. Thus, the re-inverted signal as the first priority decision signal pri_det0 of a LOW state turns on the first PMOS transistor P401. Thereby, the power supply voltage Vcc is applied to the first node Q401 so that the first node Q401 is kept at a HIGH state.

The potential of the first node Q401 kept at a HIGH state is latched by the latch means 404 and is then inverted through the second inverter I402. The potential of a HIGH state is thus applied to the third NAND gate 406. Next, the third NAND gate 406 logically combines the output signal of the second inverter I402 and the wafer burn-in test entry signal wbi_entry applied with a HIGH state to output a signal of a LOW state. The signal of the LOW state is then inverted to a HIGH state through the third inverter I403, which is then outputted as the first priority signal pri0.

However, the output signal of the first NAND gate 401 maintains a potential of a HIGH state through the inverse delay means 403 and is then inputted to the other input terminal of the NOR gate 402. Thereby, the NOR gate 402 outputs a signal of a LOW state. This signal is then inverted to a HIGH state through the first inverter I401 to turn off the first PMOS transistor P401 as the first priority decision signal pre_det0. Therefore, the first priority signal pri0 of a HIGH state is outputted during the time when the signal is latched in the latch means 404.

Thereafter, if the second shift register is driven, the output signal Q1 is applied with a HIGH state. The second priority decision signal pri_det1 of the second priority decision means 42 is outputted with a LOW state. Therefore, the second NAND gate 403 in the first priority decision means 41 logically combines the power-up signal pwrup of a HIGH state and the second priority decision signal pri_det1 of a LOW state to output the first reset signal reset0 of a HIGH state. Accordingly, the first NMOS transistor N401 is turned on and the first node Q401 is inverted to a LOW state. Therefore, the first priority signal pri0 is outputted with a LOW state.

Figure 6A:
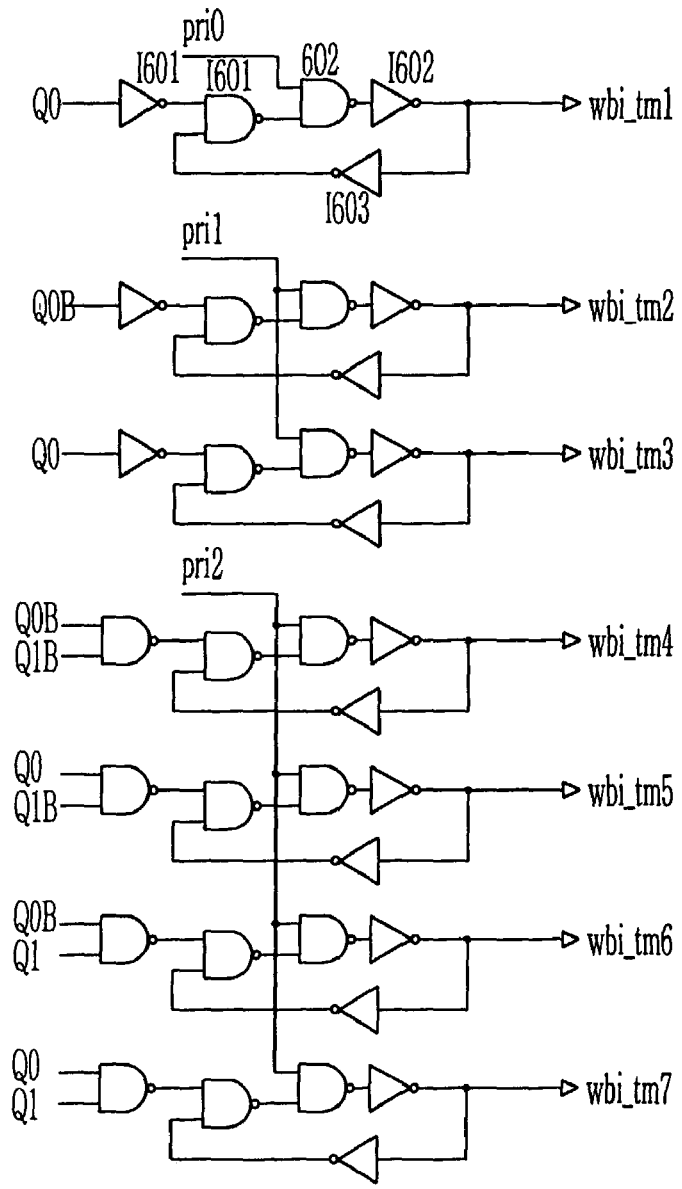
FIG. 6A and FIG. 6B show wafer burn-in test register decoder circuits.
Figure 6B:
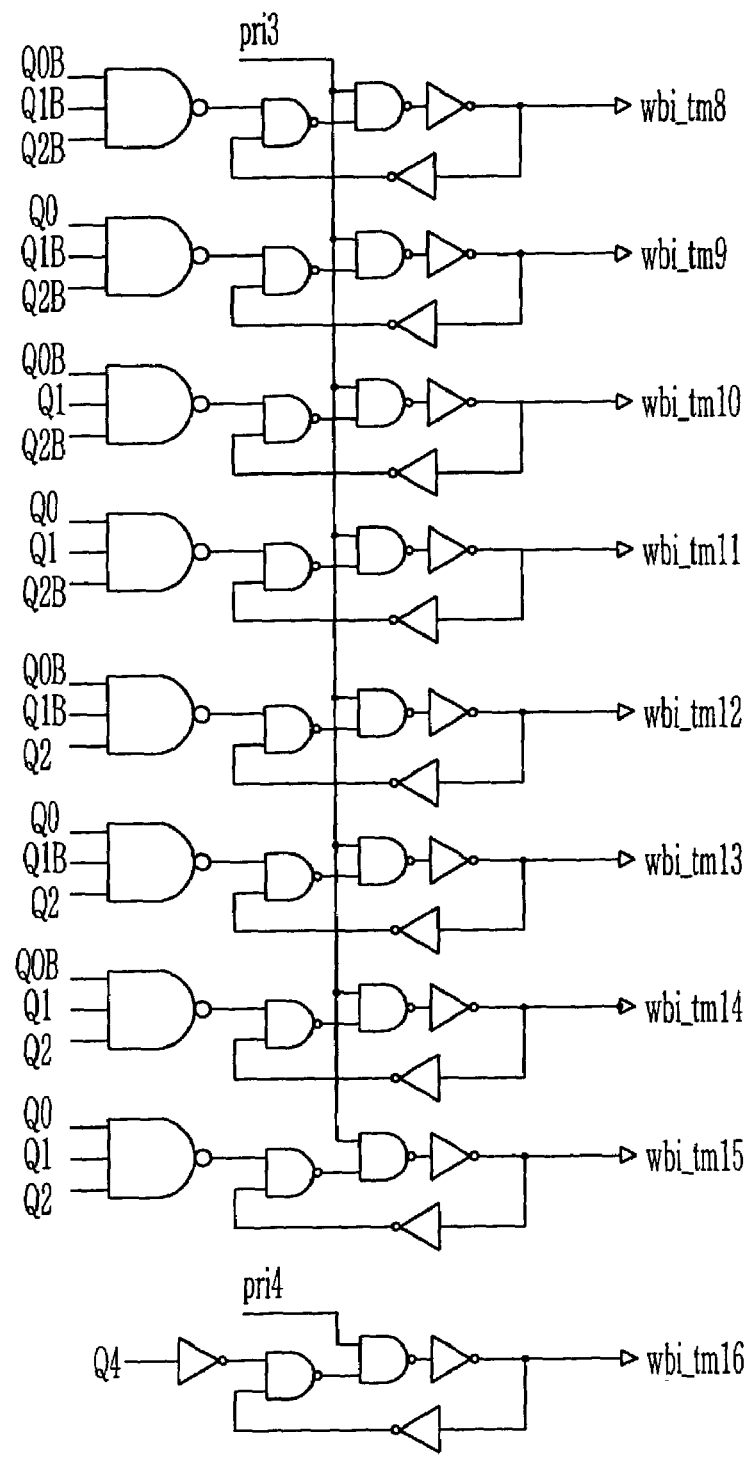

Referring now to FIG. 6A and FIG. 6B, a wafer burn-in test register decoder circuits is described. The wafer burn-in test register decoder circuit 210 outputs first through sixteenth wafer burn-in test output signals wbi_tm1–wbi_tm16 depending on output signals Q0–Q4 of first through fifth shift registers 311–315, respectively, and the first through fifth priority signals pri0–pri4. The decoding circuit for outputting a single wafer burn-in test output signal, however, includes an inverter or a first NAND gate for logically combining an output signal of the shift register, a second NAND gate for logically combining an output signal of the inverter or the first NAND gate and an inverse signal of the wafer burn-in test output signal, a third NAND gate for logically combining an output signal of the second NAND gate and a priority signal, and an inverter for inverting an output signal of the third NAND gate to output a wafer burn-in test output signal.

For example, a circuit for outputting the first wafer burn-in test signal wbi_tm1 depending on the output signal Q0 of the first shift register and the first priority signal pri0 is described. The first NAND gate 601 logically combines the first shift register output signal Q0 inverted through the first inverter I601 and the first wafer burn-in test signal wbi_tm1 inverted through the third inverter I603. The second NAND gate 602 logically combines the first priority signal pri0 and an output signal of the first NAND gate 601. The second inverter I602 inverts an output signal of the second NAND gate 602 to output the first wafer burn-in test signal wbi_tm1.

The wafer burn-in test register decoder 210 classifies test items having the same priority by decoding the output value of the shift register in the previous stage. In other words, even with the test item having the same priority, only one is selected depending on an output value of the shift register in the previous stage. Therefore, it is required that values corresponding to decoding combination of the item be a tested address input that is sequentially inputted.

TABLE 1

| | Q0 | Q1 | Q2 | Q3 | Q4 | wbi_tm |
|---|---|---|---|---|---|---|
| Priority 0 Group | 1 | 0 | 0 | 0 | 0 | wbi_tm1 |
| Priority 1 Group | X | 1 | 0 | 0 | 0 | wbi_tm2□wbi_tm3 |
| Priority 2 Group | X | X | 1 | 0 | 0 | wbi_tm4□wbi_tm7 |
| Priority 3 Group | X | X | X | 1 | 0 | wbi_tm8□wbi_tm15 |
| Priority 4 Group | X | X | X | X | 1 | wbi_tm16 |

Figure 5:
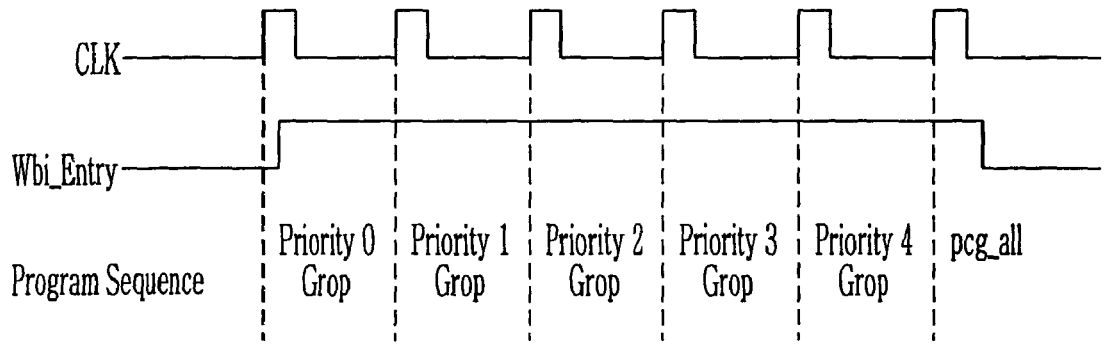
FIG. 5 shows a program flowchart of a wafer burn-in test.

Table 1 shows that the test item having the same priority is sorted. In other words, a test is performed for an item depending on the first wafer burn-in test signal wbi_tm1 corresponding to the priority 0 group according to the output signal Q0 of the first shift register 311. A test is performed for an item depending on the second and third wafer burn-in test signals wbi_tm2 and wbi_tm3 corresponding to the priority 1 group according to the output signal Q1 of the second shift register 312. Further, a test is performed for an item depending on the fourth through seventh wafer burn-in test signals wbi_tm4–wbi_tm7 corresponding to the priority 2 group according to the output signal Q2 of the third shift register 313. A test is performed for an item depending on the eighth through fifteenth wafer burn-in test signals wbi_tm8–wbi_tm15 corresponding to the priority 3 group according to the output signal Q3 of the fourth shift register 314. A test is performed for an item depending on the sixteenth wafer burn-in test signal wbi_tm16 corresponding to the priority 4 group according to the output signal Q4 of the fifth shift register 315. In the above priority groups, as the wafer burn-in test entry signal wbi_entry is applied with a HIGH state and the respective shift register is sequentially driven depending on the clock signal clk, a wafer burn-in test is performed for an item according to the priority group as shown in FIG. 5.

Figure 7:
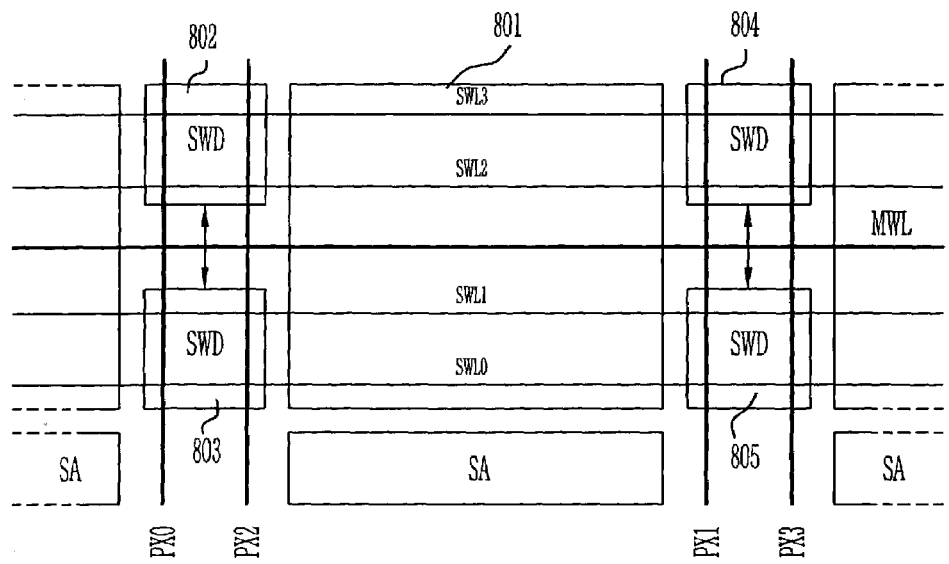
FIG. 7 shows a sub-wordline decoding structure in a memory core.
Figure 8:
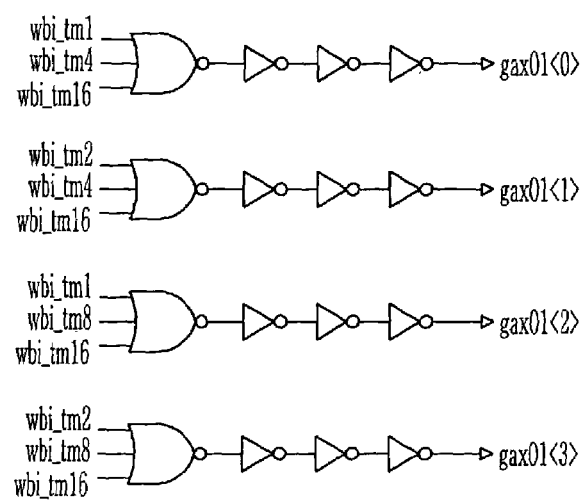
FIG. 8 shows a lowest row address generating circuit in a wafer burn-in test.

FIG. 7 and FIG. 8 show various stress patterns such as stress between cells, ONO stress, stress between plugs, or the like necessary to test the memory cell during the test related to the wafer burn-in test.

Referring to FIG. 7, a sub-wordline decoding structure in the memory core is shown. Any one of the sub-wordlines SWLO, SWL1, SWL2 and SWL3 is activated depending on values of signals PXO, PX1, PX2 and PX3 by which a single main wordline MWL activates the sub-wordlines using four sub-wordline decoders 802–805. At this time, the signals PXO, PX1, PX2 and PX3 for activating the sub-wordlines predecode the lowest row address gax01. Even-numbered and odd-numbered sub-wordlines may be activated to apply various stress to even-numbered and odd-numbered wordlines, respectively. Also, neighboring sub-wordlines may be activated to verify interference between neighboring wordlines.

Further, that all the sub-wordlines may be activated to apply stress to all the cells. A reference numeral 801 which is not described denotes a memory cell array.

FIG. 8 shows a circuit diagram for logically combining the test items wbi_tm1, wbi_tm2, wbi_tm4, wbi_tm8 and wbi_tm16 with each test items having different priority to generate a row address to activate the sub-wordline as described above. As shown, the circuit for generating the row address includes a NOR gate and odd-numbered inverters for inverting an output signal of the NOR gate. In other words, odd-numbered wordline, even-numbered wordline, 2 row bar wordline, 2 row bar wordline and all the wordline are activated corresponding to the first, second, fourth, eight and sixteenth wafer burn-in test signals wbi_tm1, wbi_tm2, wbi_tm4, wbi_tm8 and wbi_tm16, as in Table 2.

TABLE 2

| | wbi_tml | wbi_tm2 | wbi_tm4 | Wbi_tm8 | wbi_tml6 |
|---|---|---|---|---|---|
| gax01<0>PX0 | 1 | 0 | 1 | 0 | 1 |
| gax01<1>PX1 | 0 | 1 | 1 | 0 | 1 |
| gax01<2>PX2 | 1 | 0 | 0 | 1 | 1 |
| gax01<3>PX3 | 0 | 1 | 0 | 1 | 1 |

As mentioned above, the limit of a burn-in apparatus having a small number of channel can be overcome by a wafer burn-in test. Various test items can be supported with only a single address input. Upon a layout, the number of a global address line is reduced to allow an efficient routing. Further, stress patterns of various shapes can be implemented.

Many changes and modifications to the embodiments described herein could be made. The scope of some changes is discussed above. The scope of others will become apparent from the appended claims.

What is claimed is:

1. A wafer burn-in test mode circuit comprising:
   a command decoder configured to create a plurality of command signals in response to input signals for driving a semiconductor memory device;
   an address latch circuit configured to latch a plurality of address signals;
   a register configured to store a wafer burn-in address signal for a wafer burn-in test from the address latch according to a command signal from the command decoder;
   a wafer burn-in test mode entry circuit configured to generate a wafer burn-in test mode entry signal for performing the wafer burn-in test according to the wafer burn-in address signal and a command signal from the command decoder;
   a plurality of shift registers configured to shift the wafer burn-in address signal inputted from the register according to the wafer burn-in test mode entry signal and a wafer burn-in clock signal;
   a wafer burn-in test priority decision circuit configured to output test priority signals according to output signals of the shift registers; and
   a decoder configured to decode the output signals of the shift registers according to the priority signals and configured to output wafer burn-in test signals corresponding to a wafer burn-in test item.

2. The circuit as claimed in claim 1, wherein said wafer burn-in test mode entry circuit includes:
   a transmission gate configured to transfer the wafer burn-in address signal according to a test mode enable signal and an inverting signal thereof;
   a first latch circuit configured to latch the wafer burn-in address signal transferred through the transmission gate;
   a logic circuit configured to logically combine an output signal of the first latch circuit and a signal that is created by delaying and inverting the output signal of the first latch circuit;
   a first delay circuit configured to delay an output signal of the logic circuit, in which an output of the first delay circuit is inputted to the plurality of shift registers;
   a second latch circuit configured to latch an output signal of the logic circuit; and
   a second delay circuit configured to delay and to invert an output signal of the second latch circuit thereby generating the wafer burn-in test mode entry signal.

3. The circuit as claimed in claim 2, wherein the logic circuit is a NOR gate.

4. The circuit as claimed in claim 2, wherein the second latch circuit includes first and second NOR gates, the first NOR gate configured to logically combine an output signal of the logic circuit and an output signal of the second NOR gate, and the second NOR gate configured to logically combine an output signal of the first NOR gate, a pre-charge signal from the decoder and an inverted power-up signal.

5. The circuit as claimed in claim 1, wherein a wafer burn-in clock signal is generated by combing a test mode enable signal and a test mode clock signal with an NAND gate and by inverting an output signal thereof.

6. The circuit as claimed in claim 1, wherein the wafer burn-in test priority decision circuit includes a plurality of wafer burn-in test priority decision circuits, the number of which is identical to that of the plurality of shift registers.

7. The circuit as claimed in claim 6, wherein each of the wafer burn-in test priority decision circuits includes:
- a first logic circuit configured to logically combine an output signal of one of the plurality of shift registers and each inverting output signal of the remaining shift registers;
- a delay circuit configured to invert and to delay an output signal of the first logic circuit; a second logic circuit configured to logically combine the output signal of the first logic circuit and an output signal of the delay circuit to output a priority decision signal;
- a first switching circuit configured to supply a power supply voltage to a first node according to a priority decision signal of the second logic circuit;
- a third logic circuit configured to logically combine a power-up signal and a control signal;
- a second switching circuit configured to control the potential of the first node according to an output signal of the third logic circuit;
- a latch circuit configured to latch the potential of the first node; and
- a fourth logic circuit configured to logically combine an inverse signal of an output signal of the latch circuit and the wafer burn-in test entry signal to output a test priority signal.

8. The circuit as claimed in claim 7, wherein the first logic circuit is a NAND gate.

9. The circuit as claimed in claim 7, wherein the second logic circuit includes:
- a NOR gate; and
- an inverting circuit configured to invert an output signal of the NOR gate.

10. The circuit as claimed in claim 7, wherein the first switching circuit is a PMOS transistor connected between a power supply terminal and the first node.

11. The circuit as claimed in claim 7, wherein the third logic circuit is a NAND gate.

12. The circuit as claimed in claim 7, wherein the second switching circuit is a NMOS transistor connected between the first node and a ground terminal.

13. The circuit as claimed in claim 7, wherein the fourth logic circuit includes:
- a NAND gate; and
- an inverting circuit configured to invert an output signal of the NAND gate.

14. The circuit as claimed in claim 1, wherein said wafer burn-in test mode register decoder is configured to decode a test priority signal, a shift register output signal, and an inverse signal of the shift register output signal to classify test items having the same priority.

* * * * *